(12) United States Patent
Morita et al.

(10) Patent No.: US 8,513,534 B2
(45) Date of Patent: Aug. 20, 2013

(54) SEMICONDUCTOR DEVICE AND BONDING MATERIAL

(75) Inventors: Toshiaki Morita, Hitachi (JP); Yusuke Yasuda, Hitachi (JP); Eiichi Ide, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 325 days.

(21) Appl. No.: 12/379,644

(22) Filed: Feb. 26, 2009

(65) Prior Publication Data

US 2009/0244868 A1 Oct. 1, 2009

(30) Foreign Application Priority Data

Mar. 31, 2008 (JP) ................................ 2008-089166

(51) Int. Cl.
*H05K 1/03* (2006.01)

(52) U.S. Cl.
USPC ........... 174/255; 174/252; 174/254; 174/256; 174/257; 174/258; 361/783

(58) Field of Classification Search
USPC ........................................ 361/783; 174/252
See application file for complete search history.

(56) References Cited

U.S. PATENT DOCUMENTS

| | | | | |
|---|---|---|---|---|
| 4,633,035 | A * | 12/1986 | McMonagle | 174/257 |
| 5,055,967 | A * | 10/1991 | Sukonnik et al. | 361/706 |
| 5,272,111 | A * | 12/1993 | Kosaki | 438/614 |
| 5,687,062 | A * | 11/1997 | Larson | 361/706 |
| 5,917,157 | A * | 6/1999 | Remsburg | 174/252 |
| 6,175,084 | B1 * | 1/2001 | Saitoh et al. | 174/252 |
| 6,679,938 | B1 * | 1/2004 | Kim et al. | 75/365 |
| 2003/0207146 | A1 * | 11/2003 | Sasaki et al. | 428/627 |
| 2009/0039507 | A1 | 2/2009 | Funaki | |

FOREIGN PATENT DOCUMENTS

| | | |
|---|---|---|
| JP | 2004-107728 | 4/2004 |
| JP | 2005-136375 | 5/2005 |
| JP | 2005-277137 | 10/2005 |
| JP | 2006-041362 | 2/2006 |
| JP | 2008-004651 | 1/2008 |
| JP | 2008-161907 | 7/2008 |
| JP | 2008-166086 | 7/2008 |
| JP | 2008-178911 | 8/2008 |
| JP | 2008-244242 | 10/2008 |
| WO | WO2007/122925 | 11/2007 |

OTHER PUBLICATIONS

JP 2006-041362 English translation.*
Office Action in JP 2009-062222, issued Feb. 16, 2012, (in Japanese) [2 pgs.].
Office Action in JP 2009-062222, issued Feb. 14, 2012, (in Japanese) [2 pgs.].
Office Action in JP 2009-062222, dated May 22, 2012 (in Japanese) [2 pgs.].

* cited by examiner

*Primary Examiner* — Tuan T Dinh
*Assistant Examiner* — Steven Sawyer
(74) *Attorney, Agent, or Firm* — Antonelli, Terry, Stout & Kraus, LLP.

(57) ABSTRACT

The present invention is directed to enhancing the bonding reliability of a bonding portion between an Al electrode of a semiconductor device and a bonding material having metal particles as a main bonding agent. In the semiconductor device, a semiconductor element and an Al electrode are connected to each other with a bonding layer made of Ag or Cu interposed therebetween, and the bonding layer and the Al electrode are bonded to each other with an amorphous layer interposed therebetween. It is possible to obtain excellent bonding strength to the Al electrode by performing a bonding process in atmospheric air by using a bonding material including a metal oxide particle with an average diameter of 1 nm to 50 μm, an acetic acid- or formic acid-based compound, and a reducing agent made of an organic material.

15 Claims, 8 Drawing Sheets

AA' cross section

US 8,513,534 B2

SEMICONDUCTOR DEVICE AND BONDING MATERIAL

BACKGROUND OF THE INVENTION

1. Field of the Invention

The present invention relates to a bonding material employing metal particles with a diameter of 1 nm to 50 μm as a main bonding agent, and also relates to a semiconductor device on which a bonding process is performed by the use of the bonding material.

2. Description of the Related Art

It is known that, when a diameter of a metal particle decreases to 100 μm or less and the number of constituent atoms decreases, the ratio of a surface area to a volume of the metal particle sharply increases so that the melting point or sintering temperature of the metal particle is considerably lowered compared to that of a bulk-type metal. It has been studied to use a metal particle with a diameter of 1 nm to 100 nm as a bonding material by utilizing the low-temperature sinterability (refer, for example, to Japanese Patent Application Laid-Open (JP-A) No. 2004-107728). JP-A No. 2004-107728 discloses that a bonding process is carried out by performing a heating process to decompose an organic material and sinter metal particles to each other by using a bonding material prepared by coating a core made of metal particles having an average diameter of 100 nm or less with the organic material. In this bonding method, since the bonded metal particles change to a bulk metal and simultaneously the bonded metal particles are bonded through the metallic bonding at a bonding boundary, they have extremely high heat resistance, reliability, and high heat dissipation property. Furthermore, while a lead-free solder has been demanded in the connection of electronic parts, etc, lead-free materials as a substitute for high-temperature solders have not been developed yet. In mounting electronic parts, it is indispensable to use hierarchical soldering, and therefore there is an ongoing demand for the advent of a material in place of the high-temperature solders. Accordingly, it is also expected that the bonding technique of the present invention can provide a material capable replacing the high-temperature solder.

The present inventors have made a study on the bonding material using metal particles with an average diameter of 100 nm or less as a main bonding agent which is disclosed in JP-A No. 2004-107728. As a result, it has been found that while the bonding material can provide satisfactory bonding strength to a mating electrode formed of gold (Au), silver (Ag), or palladium (Pd) as a material to be bonded, no sufficient bonding strength can be obtained to aluminum (Al) that is popularly used in the mounting of the semiconductors. FIG. 8 shows evaluation results of the bonding strength of each electrode material. A bonding process was performed on Au, Ag, Al, Ni, and Cu electrodes in atmospheric air under conditions that a bonding temperature and a pressure are maintained constantly, e.g., 250° C. and 1.0 MPa, respectively, and a bonding material employs silver particles with an average diameter of 10 nm coated with an amine-based organic material. In FIG. 8, the ordinate shows a shearing strength, which is normalized with respect to the value of the Ag electrode. As a result, it can be observed that satisfactory bonding strength can be obtained in the Au and Ag electrodes but no sufficient bonding strength can be obtained in the Ni and Cu electrodes when the electrodes are bonded in atmospheric air. Moreover, it could be found that it was utterly impossible to bond the Al electrode.

The organic material coated on ultra fine particles disclosed in JP-A No. 2004-107728 is a material vanished only by heating in atmospheric air and it is not suitable for the bonding of Al which is highly susceptible to oxidation although the organic material is effective for an electrode which is less susceptible to oxidation.

In a case of bonding electronic parts constituting a semiconductor device using a bonding material employing ultra fine metal particles as a main bonding agent, it is necessary to ensure electrical conductance. Furthermore, relaxation of thermal strain and heat conductivity are also required for the bonding material. In addition, an AL electrode that is being widely used should be able to be bonded. These requirements are also applied to the bonding of a conductor and an Al member such as an Al wire and an Al base plate (heat sink plate) forming an electronic part, while not limiting to the bonding of the Al electrode and the semiconductor device.

SUMMARY OF THE INVENTION

An objective of the present invention is to enhance the bonding reliability at a bonding portion between an Al member of an electronic part and a bonding material employing metal particles as a main bonding agent.

As a result of an earnest study made by the present inventors for solving the subject described above, it has been found that excellent strength of bonding to an Al member of an electronic part can be obtained by performing a bonding operation in atmospheric air using a bonding material including a metal oxide particles, i.e., metal particle precursor with an average diameter of 1 nm to 50 μm, an acetic acid- or formic acid-based compound, and a reducing agent containing an organic material.

According to the present invention, there is provided a semiconductor device in which a semiconductor element and an Al electrode are bonded to each other with a bonding layer made of Ag or Cu interposed therebetween. The semiconductor device has a structure that the bonding layer and the Al electrode are bonded to each other with an amorphous layer interposed therebetween.

According to the present invention, there is also provided a semiconductor device including a wiring substrate having wiring layers on both sides of a ceramic dielectric substrate, a semiconductor element connected to one side of the wiring substrate, and a support connected to the other side of the wiring substrate. Herein, a bonding surface of the wiring layer is formed of Al, the semiconductor element or the support is bonded to the wiring layer by means of a sintering layer made of Ag or Cu particles, and the sintering layer and the wiring layer are bonded to each other with an amorphous layer interposed therebetween.

An objective of the present invention is to enhance the bonding reliability at a bonding portion between an Al member of an electronic part and a bonding material employing metal particles as a main bonding agent.

DESCRIPTION OF PREFERRED EMBODIMENT

Figure 1A:
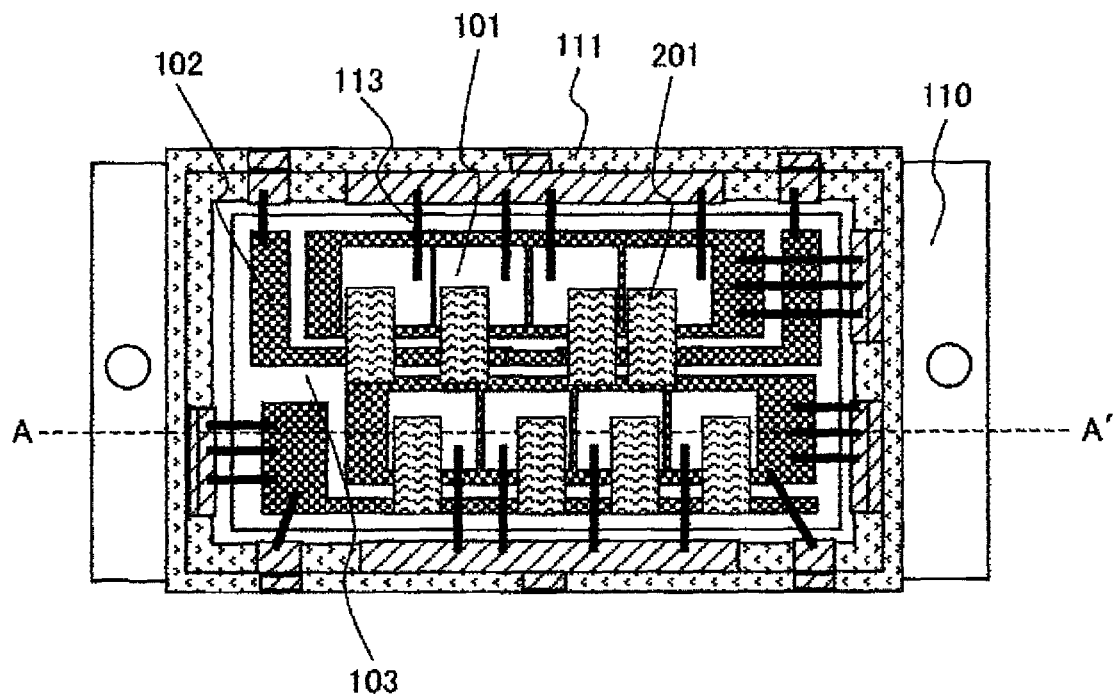
FIG. 1A is a plan view of an insulated semiconductor device according to an embodiment of the present invention.

Now, the present invention is described in detail. It was proved that, in the case of using a conventional bonding material employing metal particles with an average diameter of 100 nm or less as a main bonding agent, the conventional bonding material was not bonded to an oxide layer of an Al electrode surface. Thus, the present inventors have conducted studies thoroughly, and then found out that the excellent bonding strength could be achieved for an Al electrode by performing a bonding process in atmospheric air using a specific bonding material. That is, it was possible to achieve the excellent bonding strength for an Al electrode by performing a bonding process in atmospheric air using the specific bonding material including metal oxide particle, i.e., metal particle precursor, with an average diameter of 1 nm to 50 μm, an acetic acid- or formic acid-based compound, and a reducing agent containing an organic material. The bonding process of the present invention utilizes a phenomenon that the metal particle precursor is reduced at a temperature lower than that for thermal decomposition of the metal particle precursor alone by adding the reducing agent made of the organic material to the metal particle precursor, so that the metal particles with an average diameter of 100 nm or less are formed and the bonding is conducted through fusion of the metal particles. Since metal oxide particles start to form metal particles of 100 nm or less at a temperature of 200° C. or lower under the presence of the reducing agent, bonding can be achieved even at a low temperature of 200° C. or lower while it was difficult to achieve bonding in such a low temperature range conventionally. Furthermore, since metal particles with a diameter of 100 nm or less are formed in situ during the bonding process, it is unnecessary to prepare metal particles of which surfaces are protected by an organic material, thus making it possible to simplify the manufacturing and bonding process of the bonding material and also to remarkably reduce the cost of the bonding material. Moreover, by virtue of an acid component generated during the thermal decomposition of the acetic acid- or formic acid-based compound and the reduction of the reducing agent, a surface of an oxide layer formed on the surface of the Al electrode is activated, and resultantly the oxide layer having the activated surface and Ag or Cu can be strongly bonded to each other.

The reason why a metal oxide is defined as a metal particle precursor with an average diameter of 1 nm to 50 μm for manufacturing a metal particle of 100 nm or less is because the metal content in the metal particle precursor is high to bring about small volume shrinkage during bonding and oxygen generated during decomposition to thereby promote the oxidative decomposition of organic materials. Herein, the metal particle precursor means a material that forms metal particles with a diameter of 100 nm or less after mixed with the reducing agent and reduced by heating.

The reason why the metal particle precursor used herein is limited to have an average particle size of 1 nm to 50 μm or less is because as the average diameter of the metal particles is greater than 50 μm, the metal particles with a diameter of 100 nm or less are difficult to be prepared during bonding process. This increases a gap between the particles, thus making it difficult to obtain a dense bonding layer. Furthermore, the reason the average diameter of the metal particles is 1 nm or more is that there is a difficulty in manufacturing the metal particle precursor with an average diameter of 1 nm or less. However, in the present invention, the metal particle with a diameter of 100 nm or less can be prepared during bonding, and thus it is unnecessary to make the particle size of the metal particle precursor 100 nm or less. It is preferable that the precursor may have a particle size of 1 to 50 μm in consideration of conveniences in fabrication, handling and long-term storage of the metal particle precursor. Also, it is possible to use the metal particle precursor with a diameter of 1 nm to 100 nm to obtain a denser bonding layer.

The metal oxide particle may include silver oxide ($Ag_2O$, AgO) or copper oxide (CuO) and the bonding material including at least one kind or two kinds of the metals from the oxides may be used. Since the metal oxide particle composed of silver oxide ($Ag_2O$, AgO) or copper oxide (CuO) evolves only oxygen during reduction, few residues remain after bonding, and the volume reduction ratio is also extremely small.

The acetic acid-based compound particle may include silver acetate or copper acetate, and the formic acid-based compound particle may include silver formate or copper formate. The bonding material may include at least one kind or at least two kinds of metals from the compounds may be used. The bonding material should be in a mixed state in which the exemplified metal oxide particles and the acetic acid- or formic acid-based compound particles are mixed.

It is preferable that the content of the metal precursor particle may range from more than 50 parts by mass to 99 parts by mass or less with respect to the total mass part of the bonding material. This is because higher metal content in the bonding material can minimize the organic material residue after bonding at a low temperature so that it possible to attain a dense sintering layer and metallic bonding at the bonding boundary at a low temperature, thereby improving the bonding strength and forming a bonding layer of high heat dissipation property and high heat resistance.

The reducing agent made of the organic material may include a mixture containing at least one kind of materials selected from alcohols, carboxylic acids, and amines.

An available compound containing alcohol groups includes alkyl alcohols, for example, ethanol, propanol, butyl alcohol, pentyl alcohol, hexyl alcohol, heptyl alcohol octyl alcohol, nonyl alcohol, decyl alcohol, undecyl alcohol, dodecyl alcohol, tridecyl alcohol, tetradecyl alcohol, pentadecyl alcohol, hexadecyl alcohol, heptadecyl alcohol, octadecyl alcohol, nonadecyl alcohol, and icosyl alcohol. The alcohol groups are not restricted only to the primary alcohols, but may include secondary and tertiary alcohols such as ethylene glycol and triethylene glycol, and alkane diols, and alcohol compounds having a cyclic structure. In addition, the compound containing alcohol groups may include compounds having four alcohol groups such as citric acid and ascorbic acid.

In addition, an available compound containing carboxylic acid may include alkyl carboxylic acids. Specifically, this compound may include, for example, butanoic acid, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, pentadecanoic acid, hexadecanoic acid, heptadecanoic acid, octadecanoic acid, nonadecanoic acid, and icosanic acid. Like the alcohol groups, the available compound containing carboxylic acid is not restricted to primary carboxylic acids but may include secondary carboxylic acid, tertiary carboxylic acid, dicarboxylic acids and carboxyl compounds having a cyclic structure.

Furthermore, an available compound containing amino groups may include alkylamines. This compound may include, for example, butylamine, pentylamine, hexylamine, heptylamine, octylamine, nonylamine, decylamine, undecylamine, dodecylamine, tridecylamine, tetradecylamine, pentadecylamine, hexadecylamine, hapetadeclamine, octadecylamine, nonadecylamine, and icodecylamine. The compounds having the amino groups may also have a branched structure and they include, for example, 2-ethylhexylamine, and 1,5-dimethylhexylamine. Likewise, the amino groups are not restricted only to the primary amines, but may include secondary amines and tertiary amines. The organic material may have a cyclic structure.

The reducing agent used herein is not restricted to the organic materials containing alcohols, carboxylic acids, and amines, but may include organic materials containing aldehyde groups, ester groups, sulfanyl groups, ketone groups, etc.

The reducing agent which has a liquid phase at 20° C. to 30° C., for example, ethylene glycol or triethylene glycol, must be used just after mixed with silver oxide ($Ag_2O$) because it reduces the silver oxide to silver after one day elapses from the mixing.

On the other hand, since myristyl alcohol, lauryl amine, ascorbic acid, etc., which have a solid phase in a temperature range from 20° C. to 30° C., do not react significantly even when it is left for about one month together with metal oxide or the like, they are excellent in storability and used preferably in a case where they are stored for a long time after the mixing. Furthermore, since the reducing agent acts as a protective film for refined metal particles having a particle size of 100 nm or less after reducing the metal oxide, it is desirable that the reducing agent has the certain number of carbon atoms. Specifically, the number of carbon atoms desirably may range from 2 or more to 20 or less. If the number of carbon atoms is less than 2, the growth of particles occurs simultaneously with the preparation of the metal particles, making it difficult to prepare metal particles of 100 nm or less. If the number of carbon atoms exceeds 20, the decomposition temperature increases and the sintering of the metal particles hardly occurs, resulting in a decrease in bonding strength after all.

The amount of the reducing agent to be used may range from 1 part by mass or more to 50 parts by mass or less relative to the total mass of the metal particle precursor. The amount of the reducing agent less than 1 part by mass is not sufficient to entirely reduce the metal particle precursor in the bonding material to prepare metal particles. When, however, the reducing agent is used in excess of 50 mass %, residues after bonding increase so that it is difficult to achieve a metallic bonding at the boundary and to densify the silver bonding layer. Further, it is preferable that the weight loss of heating of the reducing agent upon heating up to 400° C. be 99% or more. When the decomposition temperature of the reducing agent is higher, residues after bonding increase to make it difficult to attain the metallic bonding at the boundary and to densify the silver bonding layer. Measurement for the weight loss of heating upon heating up to 400° C. is conducted in atmospheric air at 10° C./min using a commercially available apparatus (trade name: TG/DTA 6200, manufactured by Seiko Instruments Inc., or trade name: TGA-50, manufactured by Shimadzu Corporation).

The combination of the metal particle precursor and the reducing agent made of the organic material is not particularly restricted only if metal particles can be prepared by mixing them, but it is preferable that the combination of the metal particle precursor and the reducing agent does not form metal particles at a room temperature in consideration of storability of the bonding material.

In the bonding material, metal particles with a relatively large particle size, that is, from 50 μm to 100 μm in average diameter may be used in admixture. This is because the metal particles of 100 nm or less formed during bonding serve to sinter the metal particles with an average diameter of 50 μm to 100 μm to each other. Also, metal particles with a particle size of 100 nm or less may be mixed with the bonding material in advance. As the kind of the metal particles, gold, silver or copper may be used. Besides, the metal particle may include alloys composed of at least one kind or at least two kinds of metals selected from platinum, palladium, rhodium, osmium, ruthenium, iridium, iron, tin, zinc, cobalt, nickel, chromium, titanium, tantalum, tungsten, indium, silicon, and aluminum.

The bonding material used in the embodiment includes the metal particle precursor and the reducing agent made of the organic material but may further include a solvent when it is used in a paste form. When the bonding material is used immediately after mixing, a material having a reducing effect such as alcohols, for example, methanol, ethanol, propanol, ethylene glycol, triethylene glycol, and terpineol may be used. When the bonding material is stored for a long time, it is preferable that a material showing weak reducing effect at a room temperature such as water, hexane, tetrahydrofuran, toluene and cyclohexane may be used. Furthermore, when the reducing agent includes myristyl alcohol causing less reduction at a room temperature, the bonding material can be stored for a long time. However, in a case of using a solvent having a strong reducing effect such as ethylene glycol, this may be used in a mixed state.

To improve the dispersibility of the metal particle precursor in the solvent, a dispersant may be used optionally to cover the periphery of the metal particle precursor with the organic material to thereby improve the dispersibility. The dispersant used in the present invention includes polyvinyl alcohol, polyacrylonitrile, polyvinyl pyrrolidone, and polyethylene glycol, but also commercial dispersants. To be specific, examples of the commercial dispersants may include polymeric dispersants such as disperbyk 160, disperbyk 161, disperbyk 162, disperbyk 163, disperbyk 166, disperbyk 170, disperbyk 180, disperbyk 182, disperbyk 184, and disperbyk 190 (manufactured by BYK Japan KK.), MEGAFACK F-479 (DAINIPPON INK AND CHEMICALS, INCORPORATED) SOLSPERSE 20000, SOLSPERSE 24000, SOLSPERSE 26000, SOLSPERSE 27000 and SOLSPERSE 28000 (manufactured by Avecia Co.). The amount of the dispersant to be used is within a range of 0.01 wt % or more but not exceeding 45 wt % based on the metal particle precursor in the bonding material.

A method of applying a paste material includes a method of jetting out a paste through a fine nozzle by an inkjet process and coating the paste to a connection portion of an electrode or electronic part on a substrate, a method of coating only a necessary portion using a metal mask or mesh-like mask opened at a portion to be coated, or a method of coating a necessary portion using a dispenser. There is also a method including: coating a water-repellent resin containing silicone or fluorine using a metal mask or mesh-like mask with only a necessary portion opened, or coating a photosensitive water-repellent resin on a substrate or an electronic part; performing exposure and development to remove a portion where a paste containing the fine particles is coated; and then coating the opened portion with the bonding paste. There is also a method including: coating a water-repellent resin on a substrate or an electronic part; and then removing a portion coated with a paste composed of metal particles by a laser; and then coating the opened portion with the bonding paste. The coating methods may be combined in accordance with the area and the shape of an electrode to be bonded. In a ease of using myristyl alcohol or ascorbic acid which has a solid phase at a room temperature as the reducing agent, there is a method including: mixing this reducing agent with the metal particle precursor; applying pressure to form into a sheet-like shape; and using the resultant as the bonding material.

In the bonding process using the bonding material of the present invention, metal particles with a diameter of 100 nm or less is made from the metal particle precursor during bonding, and it is necessary to apply heat and pressure to perform the metallic bonding through fusion of the metal particles with a diameter of 100 nm or less while discharging an organic material in the bonding layer. It is preferable that the bonding process may be performed at a temperature of 50° C. or more to 400° C. or lower under a pressure of 0.01 to 10 MPa for 1 see to 10 min.

In the bonding process of the present invention, metal oxide particles, acetic acid-based compounds, and formic acid-based compounds form ultra fine pure metal particles, not an oxide with a particle size of about 0.1 nm to 50 nm, by heating during the bonding process, and the ultra fine pure metal particles fuse to each other to form a bulk-type metal. This provides a feature that the melting temperature of the bulk-type metal obtained from the metal particles is equal to the melting temperature of a usual bulk-type metal, and the ultra fine pure metal particles are melted down by low-temperature heating and not re-melted after being melted until they are heated to the melting temperature of the bulk-type metal. Since the bonding process can be performed at a low temperature in a case of using ultra fine pure metal particles and the melting temperature increases after bonding, it is advantageous in that a bonded portion is not melted again as far as it is bonded to other electronic parts. Furthermore, the heat conductivity of a bonding layer after bonding may range from 50 to 430 W/mK and the heat dissipation property is also excellent. Moreover, the precursor is a metal oxide, thus providing an advantage of low fabrication cost. Also, it is necessary to coat the metal oxide particles with the organic material such as an alcohol to enhance the reducing effect. The bonding atmosphere may be air.

At a boundary bonded by the bonding material through the bonding method, an amorphous layer is formed. The metal particles formed by reduction are put to metallic bonding with a mating material by bonding, which is required for enhancing the bonding strength. Even in a case where silver oxide and copper oxide are mixed, the bonding process may be performed in the same manner as described above and it also has an advantage capable of improving the corrosion resistance.

By employing the bonding material and the bonding method described above in bonding an Al electrode of a semiconductor device, it is possible to obtain excellent bonding reliability.

Hereinafter, embodiments of the present invention will be described with reference to the drawings but it is noted that the present invention is not limited to the below-described embodiments.

(Embodiment 1)

Figure 1B:
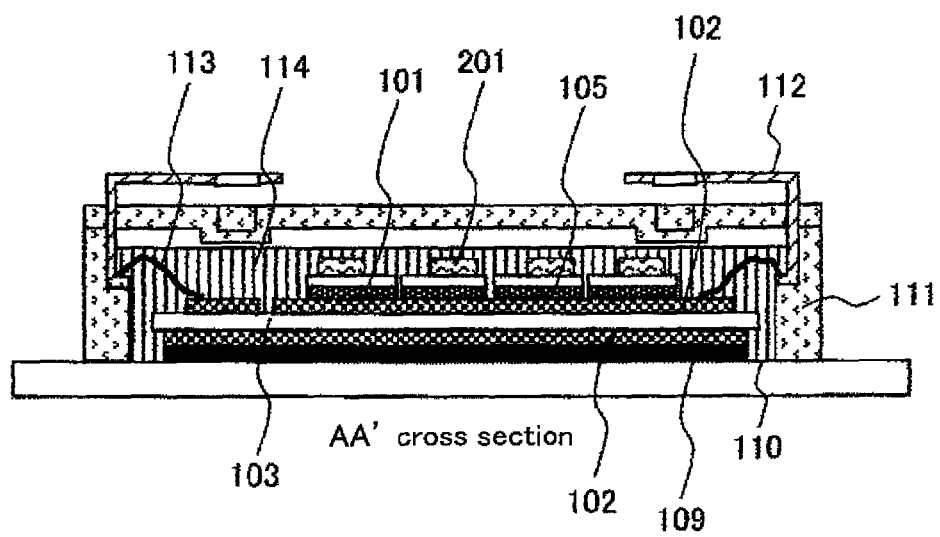
FIG. 1B is a cross-sectional view taken along line A-A in FIG. 1A.
Figure 2:
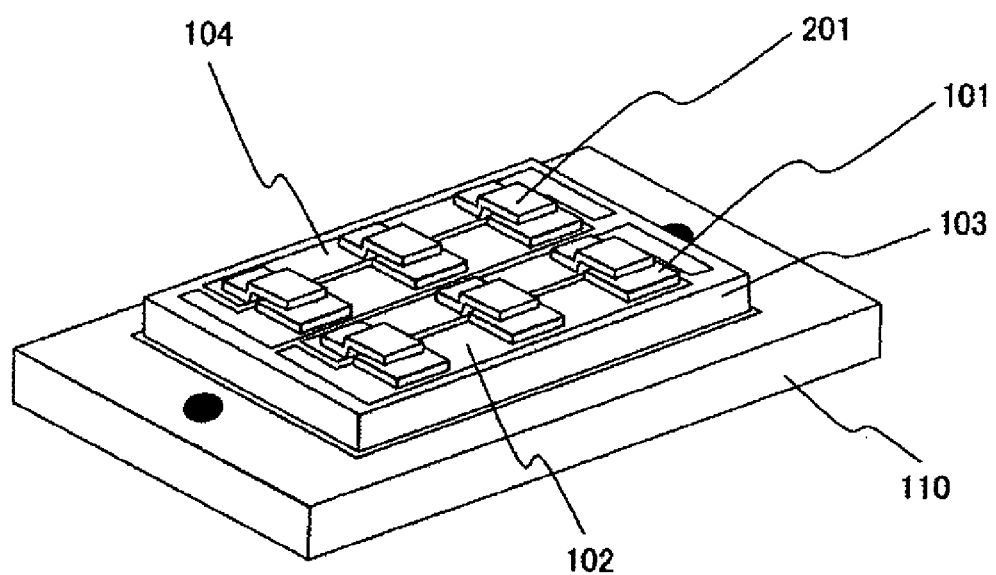
FIG. 2 is a perspective view illustrating an essential part of FIGS. 1A and 1B.

FIGS. 1A and 1B illustrate an insulated semiconductor device according to the present invention. FIG. 1A is a plan view, and FIG. 1B is a sectional view taken along line A-A' of FIG. 1A. FIG. 2 is a perspective view illustrating an essential part of the insulated semiconductor device of FIGS. 1A and 1B.

According to the embodiment, a collector electrode on one side of a semiconductor element 101 is bonded to a wiring layer 102 on a ceramic insulating substrate 103 by a bonding layer 105 containing a mixture of 80 wt % silver oxide particles (containing 5 wt % of myristyl alcohol, transformed into pure silver after the bonding) and 20 wt % silver acetate (transformed into pure silver after the bonding). The ceramic insulating substrate 103 and a support 110 are bonded to each other with a solder layer 109 interposed therebetween. The ceramic insulating substrate 103 and the wiring layer 102 are referred to as a wiring substrate. The wiring layer 102 includes an aluminum wiring. The bonding layer 105 has a thickness of 80 μm. An emitter electrode on the other side of the semiconductor element 101 is bonded to a connection terminal 201 by a bonding material (the same material as that of the bonding layer 105, transformed into pure silver after the bonding) containing a mixture of silver oxide particles and silver acetate particles. The connection terminal 201 is bonded to the aluminum wiring layer 104 on the ceramic insulating substrate 103 by using a bonding material (the same material as that of the bonding layer 105, transformed into pure silver after the bonding) containing a mixture of silver oxide particles and silver acetate particles. Other reference numerals in FIGS. 1A and 1B denote a casing 111, an external terminal 112, a bonding wire 113 and a sealing material 114, respectively.

Figure 3:
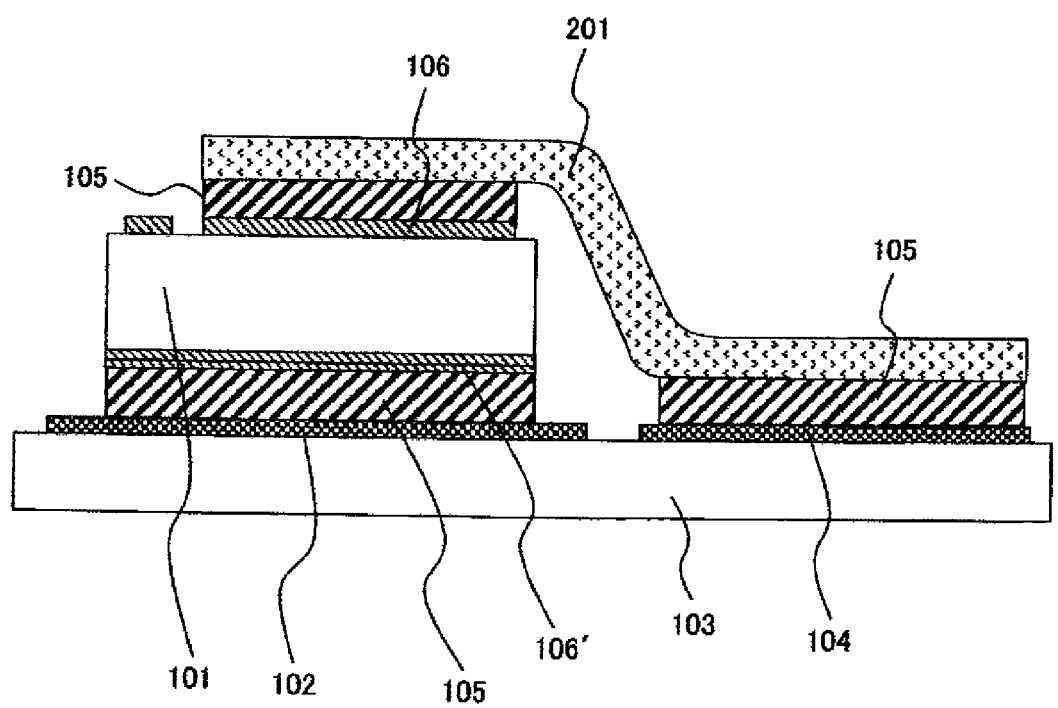
FIG. 3 is an enlarged cross-sectional view illustrating a semiconductor element mounting portion in FIGS. 1A and 1B.

FIG. 3 is a sectional view illustrating, in an enlarged scale, a semiconductor element mounting portion in FIGS. 1A and 1B. The collector electrode 106' of the semiconductor element 101 is bonded to the wiring layer 102 by a bonding layer 105 (transformed into pure silver after the bonding) containing a mixture of silver oxide particles and silver acetate particles. The wiring layer 102 includes an aluminum wiring. The material of the bonding layer 105 (transformed into pure silver after the bonding) containing a mixture of silver oxide particles and silver acetate particles is also applied to the bonding portion between the emitter electrode 106 of the semiconductor element and the connection terminal 201, and the bonding portion of the connection terminal 201 and the wiring layer 104, in the same constitution. The connection terminal 201 is formed of Cu or Cu alloy. The bodings by silver oxide particles and silver acetate particles may be performed individually or simultaneously. The bonding may be performed by disposing the bonding material containing the silver oxide particles and the silver acetate particles between the elements to be bonded, applying a heat of 250° C. for approximately 1 minute and, simultaneously, applying a pressure of 1.0 MPa in atmospheric air. Ultrasonic vibration may also be applied upon bonding.

Figure 4:
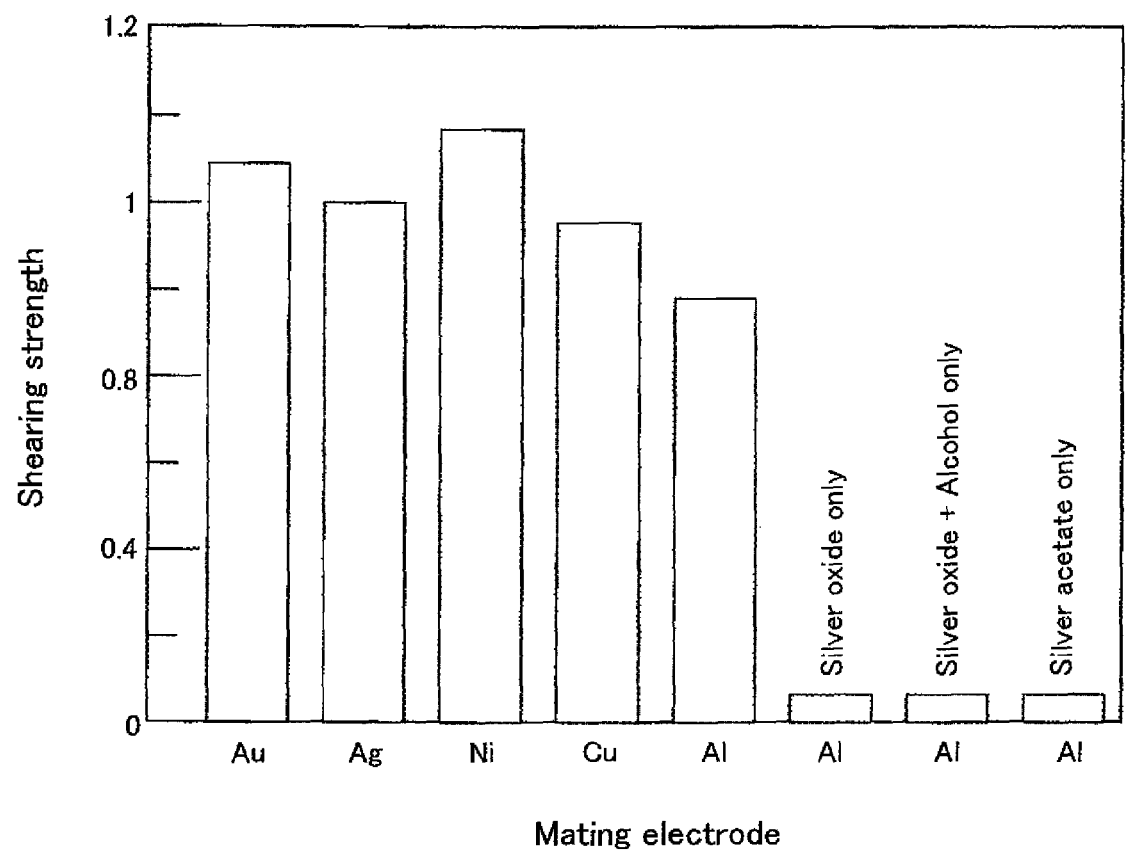
FIG. 4 is a graph showing the bondability of a bonding portion according to the present invention.

FIG. 4 illustrates the result of evaluation for the bonding strength of the bonding portion according to the present invention, which shows the effect of a mating electrode when the bonding is performed at a temperature of 250° C. and at a pressure of 1.0 MPa. In this evaluation, bondings to Au, Ag, Ni, Cu and Al electrodes were performed in atmospheric air respectively by using a bonding material containing a mixture of silver oxide particles containing 5 wt % of myristyl alcohol and having an average particle size of 2 μm and silver acetate particles having an average particle size of 10 μm. In FIG. 4, the vertical axis represents shearing strength, which is normalized based on the shearing strength value for the Ag electrode. For comparison, evaluations for Al electrode bonded by the silver oxide only, by the silver oxide containing myristyl alcohol, and by the silver acetate only were also performed.

As a result, the bonding strength to Al electrode was the same as those to Au, Ag, Ni and Cu electrodes, and was high. However, bonding was not performed in the case of by the silver oxide only and in the case of by the silver acetate only. It can be seen from the result of the evaluation that bonding to the Al electrode cannot be achieved only by the reduction effect of myristyl alcohol, or only by the reduction effect of the acidic components accompanied by the thermal decomposition of the silver acetate.

It can be seen that copper oxide may be used instead of silver oxide. Further, it can be seen that silver formate, copper acetate and copper formate may also be used instead of silver acetate, and they have the same effect as silver acetate.

From the result, it was found that bonding to the Al electrode is possible by conducting bonding in atmospheric air using the bonding material containing metal oxide particles, acetic acid- or formic acid-based compounds, and the reducing agent.

Figure 5:
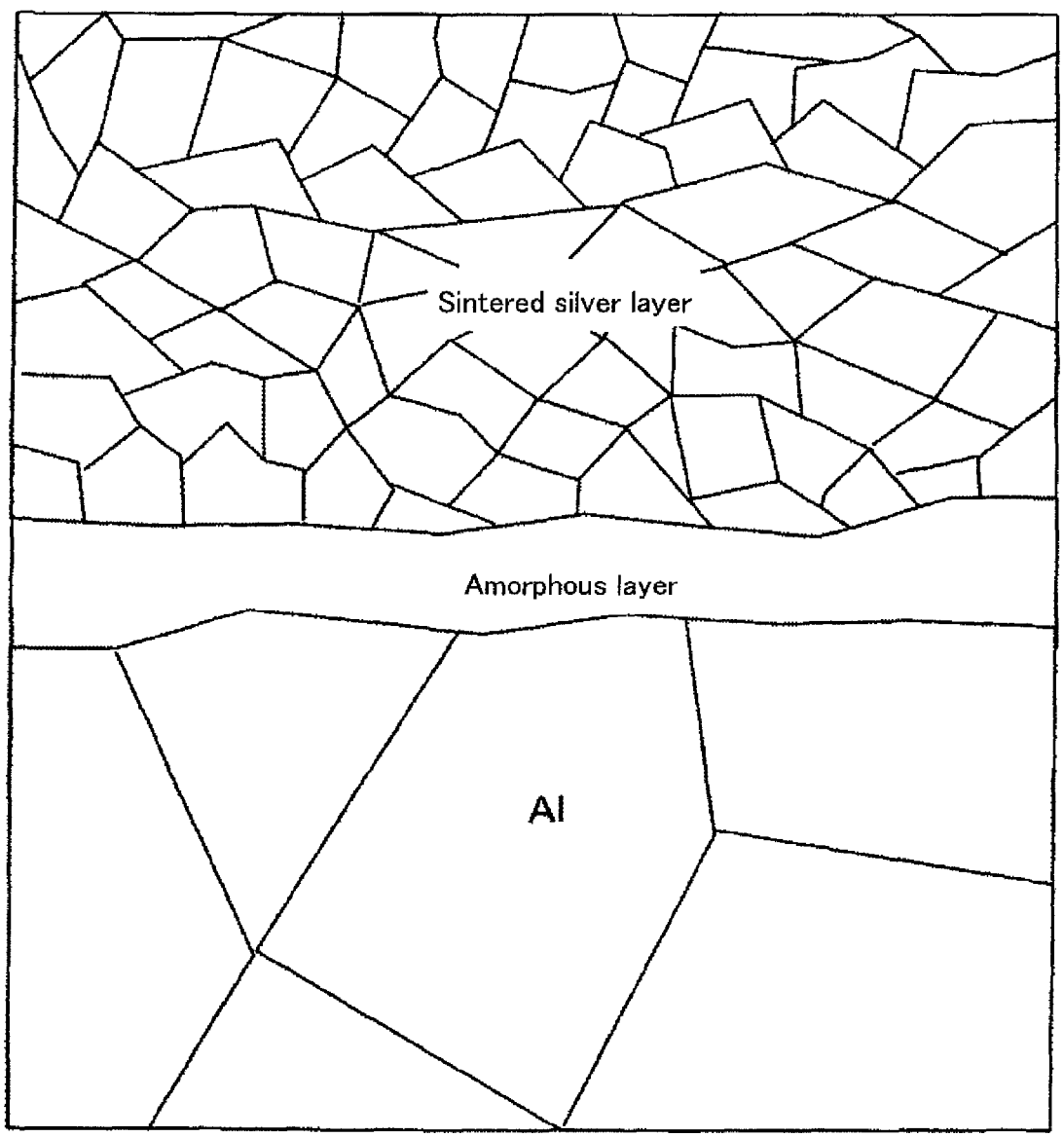
FIG. 5 is a schematic view illustrating the state of a bonding portion according to the present invention.

FIG. 5 is a view illustrating the state of the cross section of the bonding portion with Al in FIG. 4. In the method according to the present invention, it can be seen that bonding was formed to an amorphous layer on the Al surface, and a good bonding was obtained. The amorphous layer at the interface has a thickness of approximately 0.1 to 100 nm.

Hereinafter, description is to be made to a preferred embodiment of a semiconductor device according to the embodiment.

The bonding layer 105 with ultra fine metal particles shown in FIG. 3 is a portion where heat flows. Accordingly, heat dissipation property is important to the bonding layer 105 with ultra fine metal particles, and copper oxide may also be effectively used as the metal oxide particle instead of silver oxide. A mixed material of silver oxide and copper oxide may also be used. Also in this case, by the reducing effect upon heating (combined use of the reducing function of the organic material such as alcohol and the reducing atmosphere), the formed nano-sized particles are bonded with the mating electrode and the bonding can be conducted even at 200° C. or lower. The heat expansion coefficient of Cu or Cu alloys is approximately 8 ppm/° C. to approximately 16 ppm/° C. Silicon nitride may be used preferably for the ceramic insulating substrate 103. The silicon nitride has a heat expansion coefficient of approximately 9 ppm/° C. Further, the solder layer 109 may be a bonding layer using an oxide, which is a desired constitution for improving the heat dissipation property.

In the power semiconductor module of the structure according to the present invention, since the semiconductor element 101 and the insulating wiring substrate with a heat expansion coefficient of approximately 9 ppm/° C. are bonded by way of a bonding material with a heat expansion coefficient of 8 to 16 ppm/° C., it is possible to decrease the thermal stress caused by the difference of the heat expansion between each of the materials which becomes significant at a high temperature circumstance. By using the bonding material having the heat expansion coefficient identical to that of the wiring substrate, it is possible to minimize the thermal stress caused to the bonding material, thereby improving the long time reliability.

The semiconductor device according to the present invention is applicable to various types of power conversion devices. By applying the semiconductor device according to the present invention to the power conversion device, it is possible to mount the conversion device to a place in a high temperature environment and ensure long time reliability without providing an exclusive cooler.

Figure 6:
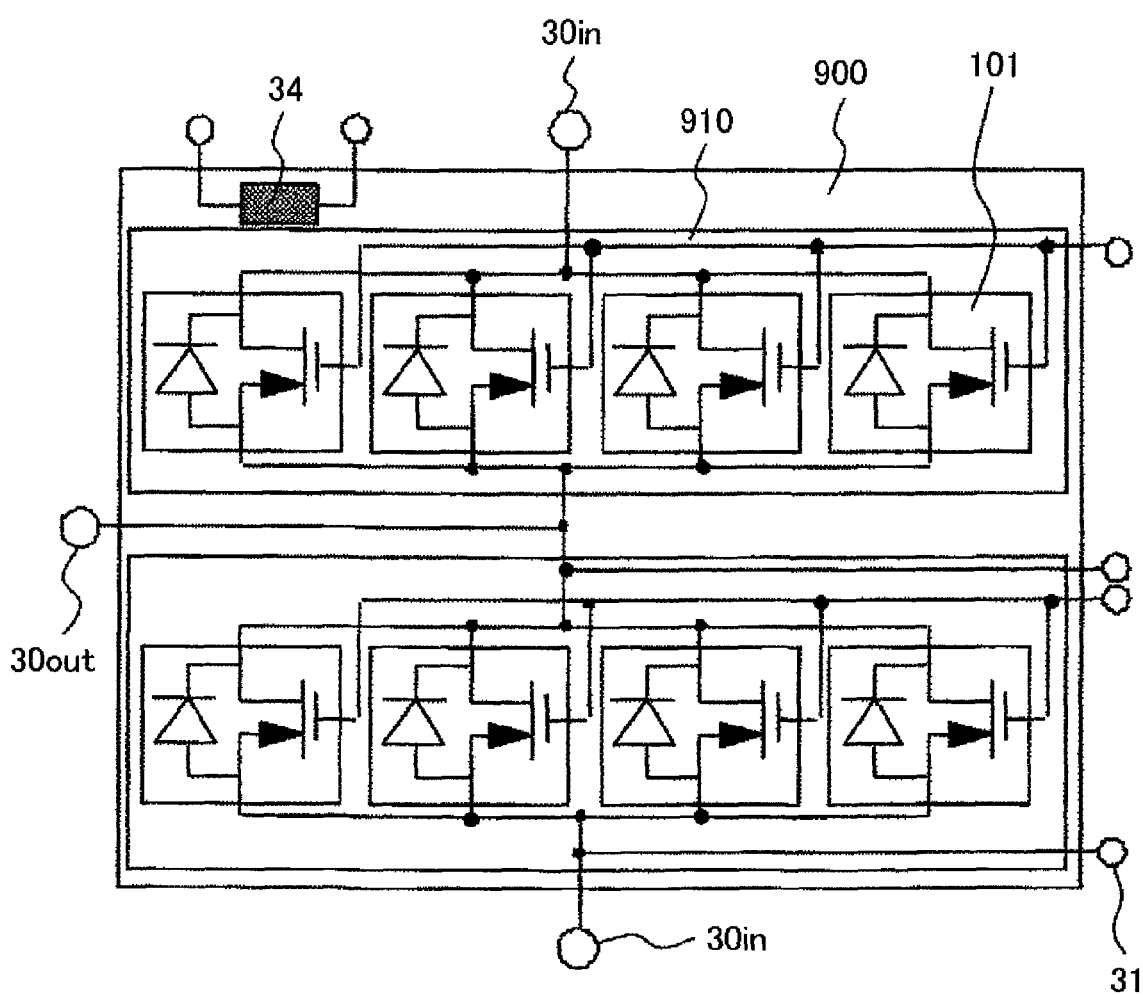
FIG. 6 is a circuit diagram of a semiconductor device.

FIG. 6 is a circuit diagram of a semiconductor device according to the present invention. The semiconductor device has two systems of blocks 910 in which four MOSFET elements 401 are disposed in parallel. Each of the blocks 910 is connected in series, in which input main terminal 30in, output main terminal 30out, and an auxiliary terminal 31 are led out from predetermined portions to constitute an essential part of the semiconductor device 900. Further, a thermistor 34 for detecting the temperature during operation of the circuit is disposed independently in the semiconductor device 900.

Figure 7:
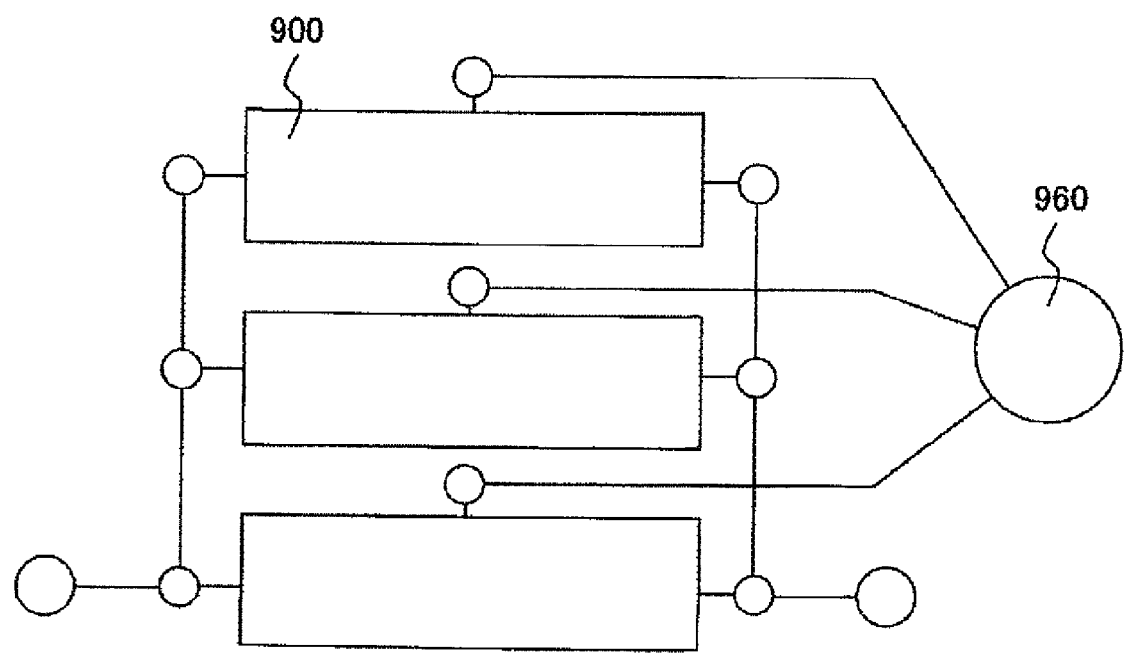
FIG. 7 is a schematic view illustrating an inverter device for controlling the number of revolutions of a hybrid car motor.
Figure 8:
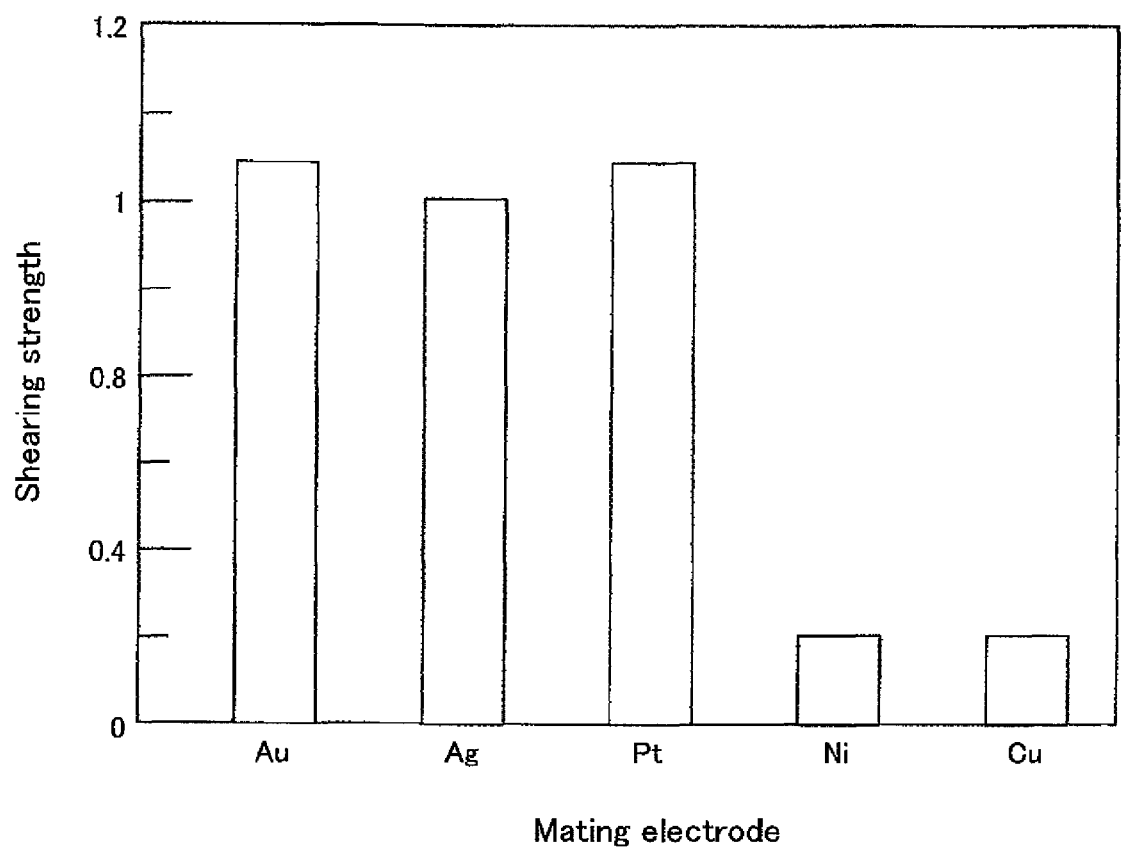
FIG. 8 is a graph showing the bondability of a bonding portion using conventional nanoparticles.

Further, an inverter and a motor can be incorporated into an electric car as a power source thereof. In the car, since the driving mechanism from the power source to wheels can be simplified, shocks upon gear change can be moderated compared with conventional cars that shift gears using the difference of the gear engaging ratio, thereby enabling smooth driving and also decreasing vibrations and noises than the conventional cars. Further, the semiconductor device 900 according to the embodiment can be incorporated into an inverter for controlling the number of rotation of a hybrid car motor 960 shown in FIG. 7.

Furthermore, the inverter incorporating the semiconductor device 900 of the embodiment can be incorporated into a cooling/heating apparatus. In this case, higher efficiency can be obtained than in a case of using a conventional AC motor. This can decrease the power consumption during use of the cooling/heating apparatus. Further, the time that the temperature of a room reaches a set temperature from the start of the operation can be shortened than in a case of using the conventional AC motor.

The same effect as in the embodiment is also applicable to a case where the semiconductor device 900 is incorporated in other apparatus for stirring or fluidizing fluids, for example, laundry machines and fluid circulation apparatus.

The bonding material of the ultra fine metal particles of the present invention is also applicable to the bonding of a portion such as an LED backlight which generates great heat.

(Embodiment 2)

Figure 9:
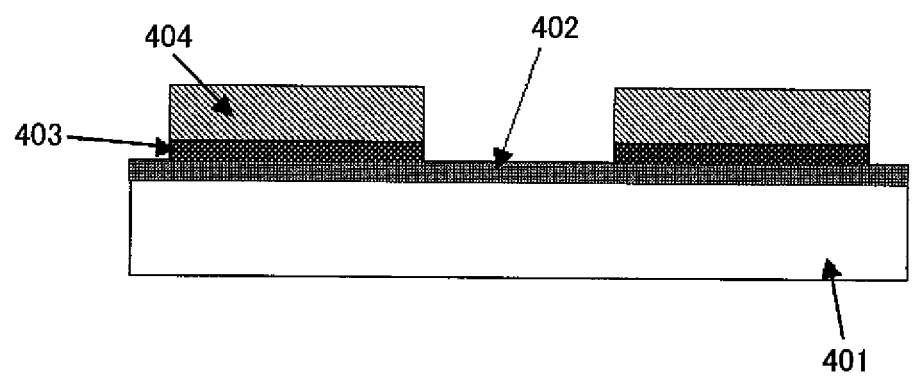
FIG. 9 is a schematic sectional view of an aluminum base insulation substrate according to an embodiment of the present invention.

In Embodiment 2, the case where the bonding according to the present invention is applied to an aluminum base insulating wiring substrate with a wiring layer on which an electronic element is mounted and a base plate on which the wiring layer is mounted. Hereinafter, the structure of the bonding according to the embodiment will be described with reference to FIG. 9. First, alumite treatment was performed on an Al base plate 401 so that an aluminum oxide layer 402 is formed on a surface of the Al base plate 401. An aluminum base insulating wiring substrate was obtained by bonding a metal wiring layer 404 to the aluminum oxide on the surface of the Al base plate using a bonding material according to the present invention. In the embodiment, the metal wiring layer 404 is formed of copper. The bonding was performed at a temperature of 250° C., and at a pressure of 1 MPa for 1 minute in an atmospheric air by using the bonding material as described in Embodiment 1.

As a result of the observation on the cross section of the alumite-treated Al base plate and the bonding layer, it was found that silver layer is bonded to aluminum of the Al base plate by way of amorphous aluminum oxide, and good bonding was achieved.

Further, conductivity test was performed on the sample, however, electrical conductivity was not observed. That is, insulation between the Al base plate and the wiring was secured by the oxide layer formed on the surface of the Al base plate. The thickness of the oxide layer is preferably 10 μm or greater to secure the insulating property. In addition, if the oxide layer is excessively thick, the thermal stress due to the difference of the heat expansion rate between the aluminum of the base material and the oxide layer may cause problems such as bending. Accordingly, the oxide layer preferably has a thickness of 500 μm or thinner.

Figure 10:
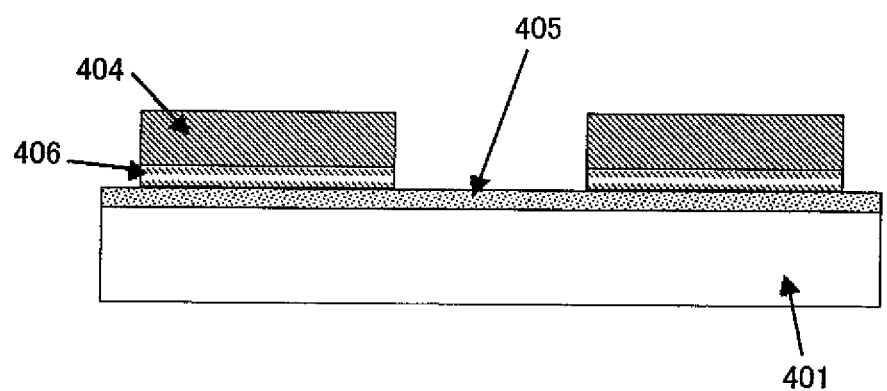
FIG. 10 is a schematic sectional view of a conventional aluminum base insulation substrate.

An example of a conventional aluminum base insulating wiring substrate is shown in FIG. 10. As shown in FIG. 10, in the conventional structure, a resin insulating layer 405 is disposed between an Al base plate 401 and a metal wiring layer 404 to secure insulation between the Al base plate 401 and the metal wiring layer 404. The resin insulating layer 405 and the metal wiring layer 404 are bonded by using a bonding agent 406, and an epoxy-based bonding agent and the like may be used as the bonding agent 406. It is difficult to use at a temperature 150° C. or higher an aluminum base insulating wiring substrate securing the insulating property by means of resin insulating layer 405 as described above because of the resin insulating layer 405 or the bonding agent 406, and such an aluminum base insulating wiring substrate has a limit in the heat resistance. In addition, it has a limit in improving the heat dissipation property because the resin insulating layer and the bonding agent cannot be improved in the thermal conductivity. A structure including a ceramic substrate as an insulating element may also be used instead of the structure of FIG. 10 including a resin insulating layer as the insulating element. In this case, the bonding between the ceramic substrate and the wiring layer may be performed by using a silver soldering material having a melting temperature of approximately 800° C. This structure has good heat resistance, however, has a limit in improving the heat dissipation property as in the case of using the resin insulating layer.

On the contrary, the structure according to the embodiment secures insulation by means of the aluminum oxide layer 402 formed on the surface of the Al base plate 401, and thus does not need the resin insulating layer and the ceramic substrate. The aluminum oxide layer is excellent in heat resistance and thermal conductivity in comparison to the resin insulating layer and the ceramic substrate. In addition, in the embodiment, the bonding between the Al base plate and the wiring layer is achieved by means of a sintered body of metal particles, and thus has excellent heat resistance and thermal conductivity in comparison to the conventional bonding agent. In this way, the aluminum base insulating wiring substrate according to the embodiment can be improved in heat resistance and heat dissipation property in comparison to the conventional structure.

DESCRIPTION OF REFERENCE NUMERALS

101: Semiconductor Element
102: Wiring Layer
103: Ceramic Insulating Substrate
104: Wiring Layer
105: Bonding Layer
106: Emitter Electrode
110: Support
201: Connection Terminal
202, 203: Bonding Material Employing Ultra Fine Metal Particles
301: Base Metal
302: Particle Layer
401: Al Base Plate
402: Oxide Layer (Alumite-Treated Surface)
403: Silver-based Bonding Layer
404: Metal Wiring Layer
405: Resin Insulating Layer
406: Bonding Agent

The invention claimed is:

1. A semiconductor device comprising a wiring substrate including wiring layers on both sides of a ceramic insulated substrate, a semiconductor element connected to one of the sides of the wiring substrate, and a support connected to the other of the sides of the wiring substrate, wherein a bonding surface of the wiring layer bonded to the semiconductor element is comprised of Al, the semiconductor element and the wiring layer are bonded through a sintering layer comprised of Ag or Cu particles, and the sintering layer and the wiring layer are bonded to each other with an amorphous layer interposed therebetween, and wherein the amorphous layer consists of aluminum oxide, and the sintering layer and the amorphous layer are directly bonded to each other; wherein the sintering layer is formed by sintering a mixed material including metal oxide particles and either one of acetic acid particles and formic acid based particles, wherein the metal oxide particles are comprised of copper oxide or silver oxide, wherein the acetic acid particles are comprised of silver acetate or copper acetate, and wherein the formic acid particles are comprised of silver formate or copper formate.

2. The semiconductor device according to claim 1, wherein at least one bonding surface of the wiring layer connected to the support is comprised of Al, and the support and the wiring layer are bonded to each other by a sintering layer including metal particles of Ag or Cu.

3. A power conversion device comprising the semiconductor device of claim 1.

4. The semiconductor device according to claim 1, wherein the semiconductor device is configured to be used as a power conversion device.

5. The semiconductor device according to claim 1.

6. The semiconductor device according to claim 1.

7. The semiconductor device according to claim 1, wherein the heat conductivity of the sintering layer ranges from 50 to 430 W/mk.

8. A hybrid car comprising the power conversion device of claim 3 mounted in an engine compartment of said hybrid car.

9. The semiconductor device according to claim 4, wherein the power conversion device is configured to be mounted in an engine compartment of a hybrid car.

10. A semiconductor device comprising a wiring substrate including wiring layers on both sides of a ceramic insulated substrate, a semiconductor element connected to one side of the wiring substrate, and a support connected to the other side of the wiring substrate, wherein a bonding surface of the wiring layer bonded to the support is comprised of Al, the support and the wiring layer are bonded through a sintering layer comprised of Ag or Cu particles, and the sintering layer and the wiring layer are bonded to each other with an amorphous layer interposed therebetween, and wherein the amorphous layer consists of aluminum oxide, and the sintering layer and the amorphous layer are directly bonded to each other; wherein the sintering layer is formed by sintering a mixed material including metal oxide particles and either one of acetic acid particles and formic acid based particles, wherein the metal oxide particles are comprised of copper oxide or silver oxide, wherein the acetic acid particles are comprised of silver acetate or copper acetate, and wherein the formic acid particles are comprised of silver formate or copper formate.

11. A power conversion device comprising the semiconductor device of claim 10.

12. The semiconductor device according to claim 10, wherein the semiconductor device is configured to be used as a power conversion device.

13. The semiconductor device according to claim 10, wherein the heat conductivity of the sintering layer ranges from 50 to 430 W/mk.

14. A hybrid car comprising the power conversion device of claim 11 mounted in an engine compartment of said hybrid car.

15. The semiconductor device according to claim 12, wherein the power conversion device is configured to be mounted in an engine compartment of a hybrid car.

* * * * *

UNITED STATES PATENT AND TRADEMARK OFFICE
CERTIFICATE OF CORRECTION

PATENT NO. : 8,513,534 B2  
APPLICATION NO. : 12/379644  
DATED : August 20, 2013  
INVENTOR(S) : Morita et al.

Page 1 of 1

It is certified that error appears in the above-identified patent and that said Letters Patent is hereby corrected as shown below:

In the Claims column 12, line 38: cancel the text "5. The semiconductor device according to claim 1."

and insert the following claim:

--5. The semiconductor device according to claim 1, wherein the mixed material further includes a reducing agent including at least one kind of materials selected from alcohols, carboxylic acids, and amines.-- column 12, line 39: cancel the text "6. The semiconductor device according to claim 1."

and insert the following claim:

--6. The semiconductor device according to claim 1, wherein the metal oxide particles have sizes in in a range of 1 nm to 50 μm.--

Signed and Sealed this  
Tenth Day of December, 2013

Margaret A. Focarino  
*Commissioner for Patents of the United States Patent and Trademark Office*